(12) United States Patent
Peng et al.

(10) Patent No.: US 7,193,265 B2
(45) Date of Patent: Mar. 20, 2007

(54) SINGLE-POLY EEPROM

(75) Inventors: Nai-Chen Peng, Hsin-Chu (TW);
Shui-Chin Huang, Tai-Nan (TW);
Tzyh-Cheang Lee, Hsin-Chu (TW);
Chuan Fu Wang, Miao-Li County
(TW); Sung-Bin Lin, Hsin-Chu (TW)

(73) Assignee: United Microelectronics Corp.,
Hsin-Chu (TW)

( * ) Notice: Subject to any disclaimer, the term of this patent is extended or adjusted under 35 U.S.C. 154(b) by 89 days.

(21) Appl. No.: 10/907,006

(22) Filed: Mar. 16, 2005

(65) Prior Publication Data

US 2006/0208306 A1 Sep. 21, 2006

(51) Int. Cl.
*H01L 29/788* (2006.01)
(52) U.S. Cl. ..................................... 257/316
(58) Field of Classification Search ................ 257/355, 257/316
See application file for complete search history.

(56) References Cited

U.S. PATENT DOCUMENTS 5,719,427 A * 2/1998 Tong et al. ................. 257/355

6,711,064 B2 3/2004 Hsu et al.

FOREIGN PATENT DOCUMENTS

TW 536818 6/2003

\* cited by examiner

*Primary Examiner*—Carl Whitehead, Jr.
*Assistant Examiner*—Monica D. Harrison
(74) *Attorney, Agent, or Firm*—Winston Hsu (57) ABSTRACT

The single-poly EEPROM includes a first PMOS transistor serially connected to a second PMOS transistor. The first and second PMOS transistors are both formed on an N-well of a P type substrate. The first PMOS transistor includes a floating gate, a first $P^+$ doped drain region and a first $P^+$ doped source region. The second PMOS transistor includes a gate and a second $P^+$ doped source region. The first $P^+$ doped drain region of the first PMOS transistor serves as a drain of the second PMOS transistor. A diode is located in the P type substrate including a P-well and a $N^+$ doped region. The floating gate overlaps with the N-well and extends to the $N^+$ doped region. The overlapped region of the P-well and the $N^+$ doped region junction beneath the floating gate serves as an avalanche injection point in the vicinity of the first PMOS transistor.

16 Claims, 8 Drawing Sheets

SINGLE-POLY EEPROM

BACKGROUND OF INVENTION

1. Field of the Invention

The present invention relates to a single-poly electrically erasable programmable read only memory (EEPROM), and more particularly, to a single-poly EEPROM, which has high erasure efficiency.

2. Description of the Prior Art

Electronic memory comes in a variety of forms to serve a variety of purposes. Flash electrically erasable programmable read only memory (flash EEPROM) is used for easy and fast information storage in such devices as personal digital assistants (PDA), digital cameras and home video game consoles. Generally, an EEPROM chip has a grid of columns and rows with a cell that has two transistors at each intersection. One of the transistors is known as a floating gate, and the other one is the control gate. The floating gate's only link to the row, or word line, is through the control gate. As long as this link is in place, the cell has a value of 1. Changing the value to a 0 requires a well-known process called Fowler-Nordheim tunneling. It is often desirable to combine many functions on a single device, also called system-on-a-chip (SOC), to reduce the number and cost of chips. Embedding flash memory in a CMOS device allows a single chip produced by a manufacturer to be configured for a variety of applications, and/or allows a single device to be configured by a user for different applications. To combine with standard CMOS process flow, single-poly flash memory devices have been developed.

Figure 1:
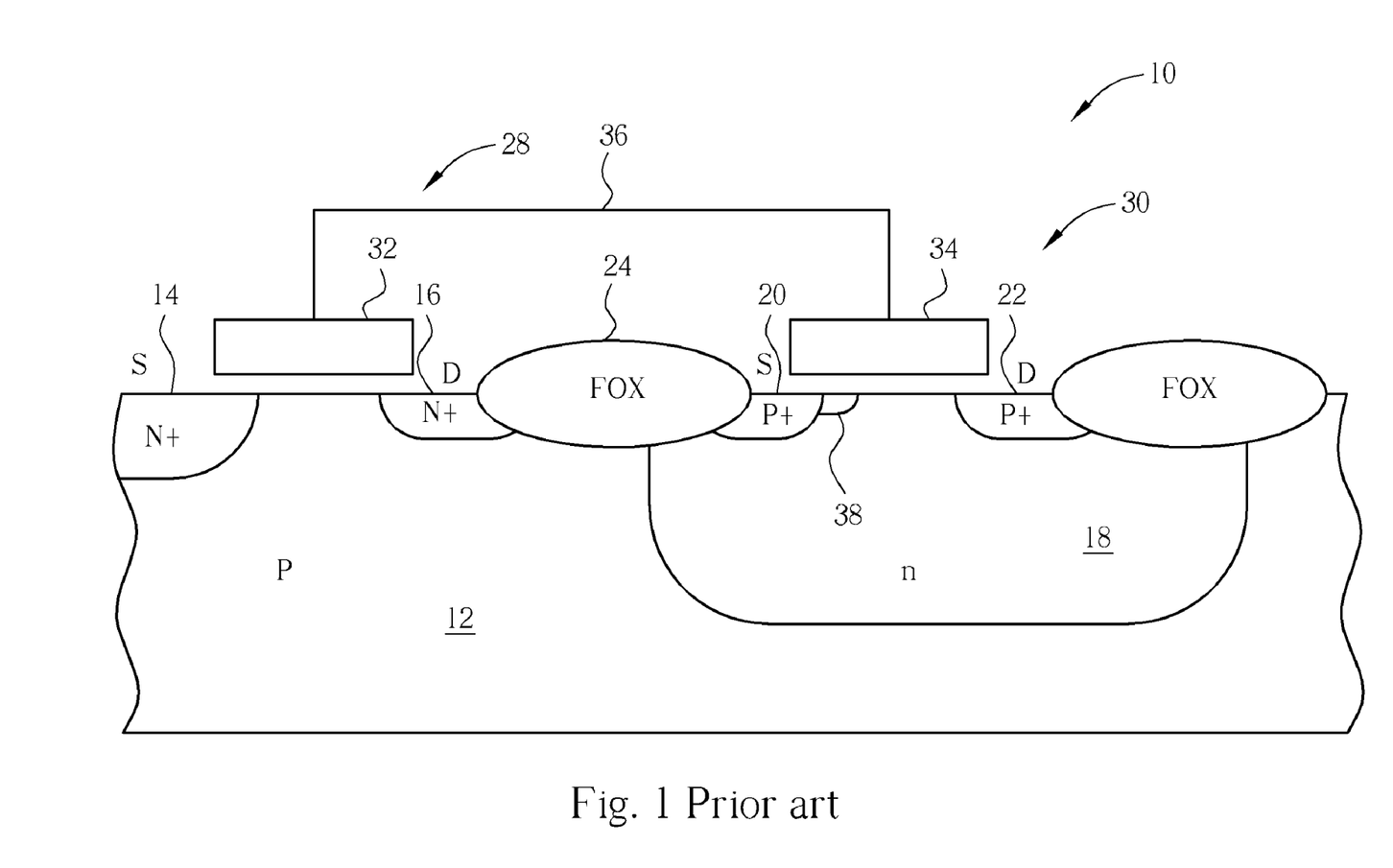
FIG. 1 is a schematic, cross-sectional view of single-poly EEPROM cell according to the prior art.

FIG. 1 is a schematic, cross-sectional view of a single-poly EEPROM cell 10 according to the prior art. As shown in FIG. 1, the EEPROM cell 10 comprises an NMOS structure 28 and a PMOS structure 30. A field oxide layer 24 isolates the PMOS structure 30 from the NMOS structure 28. The NMOS structure 28 is formed on a P type substrate 12 and comprises an NMOS gate 32, an $N^+$ source region 14, and an $N^+$ drain region 16. The PMOS structure 30 is formed on an N-well 18 and comprises a PMOS floating gate 34, a $P^+$ source region 20, and a $P^+$ drain region 22. A channel stop region 38 is obliquely implanted underneath the PMOS floating gate 34 for facilitating band-to-band hot electron injection into the PMOS floating gate. A conductor 36 directly electrically couples the NMOS gate 32 to the PMOS floating gate 34. That is, there is a conductive current path from one gate to the other, as opposed to indirectly coupling, such as capacitive coupling. Both gates 32 and 34 are floating, that is, they are not directly electrically coupled to a voltage or current source or sink on the IC, and at the same electrical potential. The conductor may be a polysilicon trace formed at the same time as the gates, or may be a metal or silicide conductor formed later in the fabrication sequence.

However, the above-described EEPROM cell 10 of the prior art suffers from several drawbacks. First, the EEPROM cell 10 consumes a lot of chip area since it is composed of a PMOS structure 30 and a NMOS structure 28, and the extra field oxide layer 24 is needed for isolating the PMOS 30 form the NMOS 28. Second, the EEPROM cell 10 needs an extra channel stop region 38 and formation of conductor 36 for connecting two gates, this, in turns, means extra process steps and thus raised cost.

SUMMARY OF INVENTION

It is therefore a primary objective of the present invention to provide a single-poly EPPROM, which has high erase efficiency and can be fabricated with conventional CMOS process sequences.

According to the above objective, a preferred embodiment of the present invention discloses a single-poly EPPROM, which includes a first PMOS transistor connected to a second PMOS transistor, wherein the first and second PMOS transistors are both formed on an N-well of a P type substrate, and wherein the first PMOS transistor includes a floating gate, a first $P^+$ doped drain region, and a first $P^+$ doped source region, the second PMOS transistor includes a gate and a second $P^+$ doped source region, and the first $P^+$ doped source region of the first PMOS transistor serves as a drain of the second PMOS transistor. The single-poly EPPROM structure further includes a diode located in the P type substrate, wherein the diode includes a P-well and an $N^+$ doped region disposed in the P-well, and wherein the floating gate of the first PMOS transistor overlaps with the N-well and the P type substrate and extends to the P-well and $N^+$ doped region, and a junction region of the P-well and the $N^+$ doped region overlapped beneath the floating gate serves as an avalanche injection point in a vicinity of the first PMOS transistor.

Another preferred embodiment of the present invention discloses a single-poly EPPROM, which includes a first PMOS transistor connected to a second PMOS transistor, wherein the first and second PMOS transistors are both formed on an N-well of a P type substrate, and wherein the first PMOS transistor includes a floating gate, a first $P^+$ doped drain region, and a first $P^+$ doped source region, the second PMOS transistor includes a gate and a second $P^+$ doped source region, and the first $P^+$ doped source region of the first PMOS transistor serves as a drain of the second PMOS transistor. The single-poly EPPROM further includes a diode and a $P^+$ doped guard ring. The diode located in the P type substrate includes a P-well and an $N^+$ doped region disposed in the P-well, and wherein the floating gate of the first PMOS transistor overlaps with the N-well and the P type substrate and extends to the P-well and $N^+$ doped region, and a junction region of the P-well and the $N^+$ doped region overlapped beneath the floating gate serves as an avalanche injection point in a vicinity of the first PMOS transistor. The $P^+$ doped guard ring is located in the P-well, wherein the floating gate of the first PMOS transistor overlaps with a portion of the $P^+$ doped guard ring to form a $P^+$ junction underneath the floating gate, and wherein a voltage applied to the $P^+$ doped guard ring is the same as the voltage applied to a P-well.

The present invention utilizes the avalanche breakdown generated in a junction region of the P-well and the $N^+$ doped region underneath the floating gate. Thereby, hot holes inject into a floating gate to neutralize the trapped electrons and Fowler-Nordheim tunneling is utilized to pull out electrons from the floating gate for executing erasure. Therefore, a single-poly EPPROM of the present invention has the following advantages:

1. The present invention utilizes a low voltage to execute an erasure operation so that the single-poly EPPROM can be fabricated with conventional CMOS process sequences without any extra process step for saving production costs.

2. The present invention utilizes the avalanche hot hole injection mechanism, whose operation speed is faster than Fowler-Nordheim tunneling, and the program/erasure cycle and the testing costs are reduced.

3. The present invention further includes a P-well underneath the floating gate. When an electrically erasure is performed, a negative voltage could be applied to the P-well to increase the voltage difference and enhance the avalanche hot hole injection mechanism and Fowler-Nordheim tunneling.

4. The present invention further includes a P+ doped guard ring underneath the floating gate in the P-well for increasing the erasure efficiency and increasing the voltage difference between the floating gate and the P+ doped guard ring to give a wide process window.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
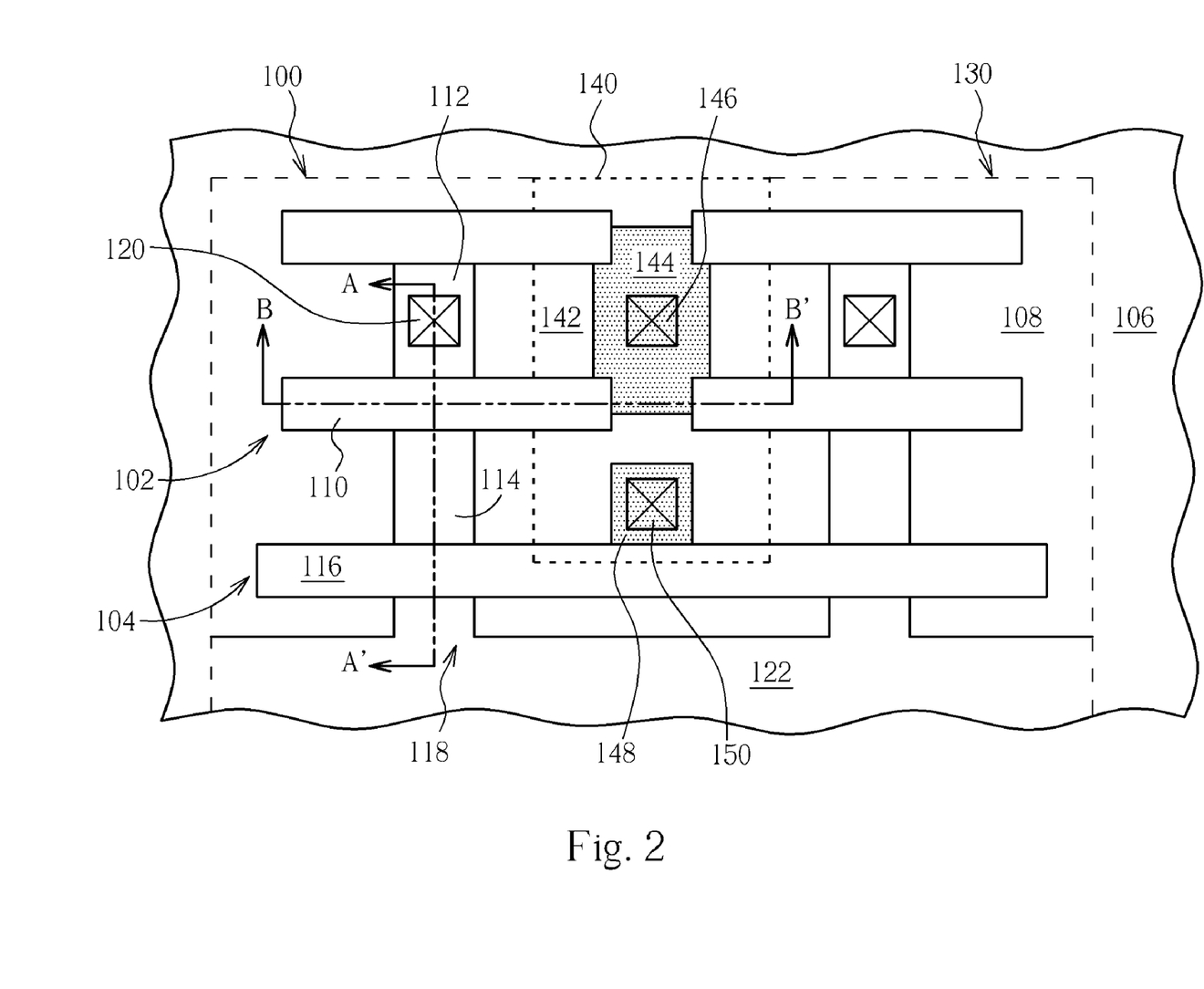
FIG. 2 is a plane view schematically illustrating a partial layout of a single-poly EEPROM according to a first preferred embodiment of the present invention.

Please refer to FIG. 2. FIG. 2 is a plane view schematically illustrating a partial layout of a single-poly EEPROM according to a first preferred embodiment of the present invention. As shown in FIG. 2, a single-poly EEPROM unit 100 includes a first PMOS transistor 102 and a second PMOS transistor 104 serially connected to the first PMOS transistor 102. The first PMOS transistor 102 and the second PMOS transistor 104 are formed on an N-well 108, as indicated by the dashed line in FIG. 2, of a P type substrate 106. The first PMOS transistor 102 includes a floating gate 110, a first P+ doped drain region 112, and a first P+ doped source region 114. The second PMOS transistor 104 includes a gate 116 and a second P+ doped source region 118, and the first P+ doped source region 114 of the first PMOS transistor 102 serves as a drain of the second PMOS transistor 104, thereby electrically connecting the first PMOS transistor 102 with the second PMOS transistor 104.

It is understood that the floating gate 110 consists of a single layer polysilicon according to the present invention, that is, there is no word line or control gate stacked thereon. The first P+ doped drain region 112 is electrically connected to a bit line (not explicitly shown in FIG. 2) through a contact plug 120. The second P+ doped source region 118 of the second PMOS transistor 104 is electrically connected with a source line 122. Preferably, the source line 122 is an embedded P+ doped region that is manufactured simultaneously with the second P+ doped source region 118 in an ion implantation process. An EEPROM unit 130 having a memory structure that is similar to the structure of the EEPROM unit 100 is also illustrated in the layout depicted in FIG. 2.

The single-poly EEPROM unit 100 further includes a diode 140 located in the P type substrate 106 and in a vicinity of the floating gate 110. The diode 140 includes a P-well 142 and an N+ doped region 144 disposed in the P-well 142. The N+ doped region 144 is electrically connected with an N+ doped region voltage ($V_N^+$) through a contact plug 146. The P-well 142 further includes a P+ doped region 148 connected with a voltage through a contact plug 150, and the voltage of the P+ doped region 148 is the same as the voltage of the P-well 142. Therefore this voltage is called a P-well voltage ($V_{PW}$). Erasing of the EEPROM unit 100 capitalizes on a so-called edge Fowler-Nordheim mechanism and an avalanche breakdown generated in a junction region of the P-well 142 and the N+ doped region 144 underneath the floating gate 110, wherein the floating gate 110 of the first PMOS transistor 102 overlaps with the N-well 108 and the P type substrate 106, and extends to the P-well 142 and the N+ doped region 144 and the junction region of the P-well 142, and the N+ doped region 144 overlapped beneath the floating gate 110 serves as an avalanche injection point in a vicinity of the first PMOS transistor 102, with the detailed description of the operation procedure being discussed hereinafter. It should be noted that the implantation of the N+ doped region 144 is carried out after the definition of the floating gate 110. That is, the implantation of the N+ doped region 144 pattern is partially masked by the floating gate 110. Accordingly, the floating gate 110 will not overlap with the subjacent N+ doped region 144 substantially. However, it is understood that diffusion of few dopants beneath the edge of the floating gate 110 is possible after going through several thermal processes. Further, compared to the EEPROM cell of the prior art, there is no conductor that connects the floating gate 110 and gate 116 according to the present invention.

Figure 3:
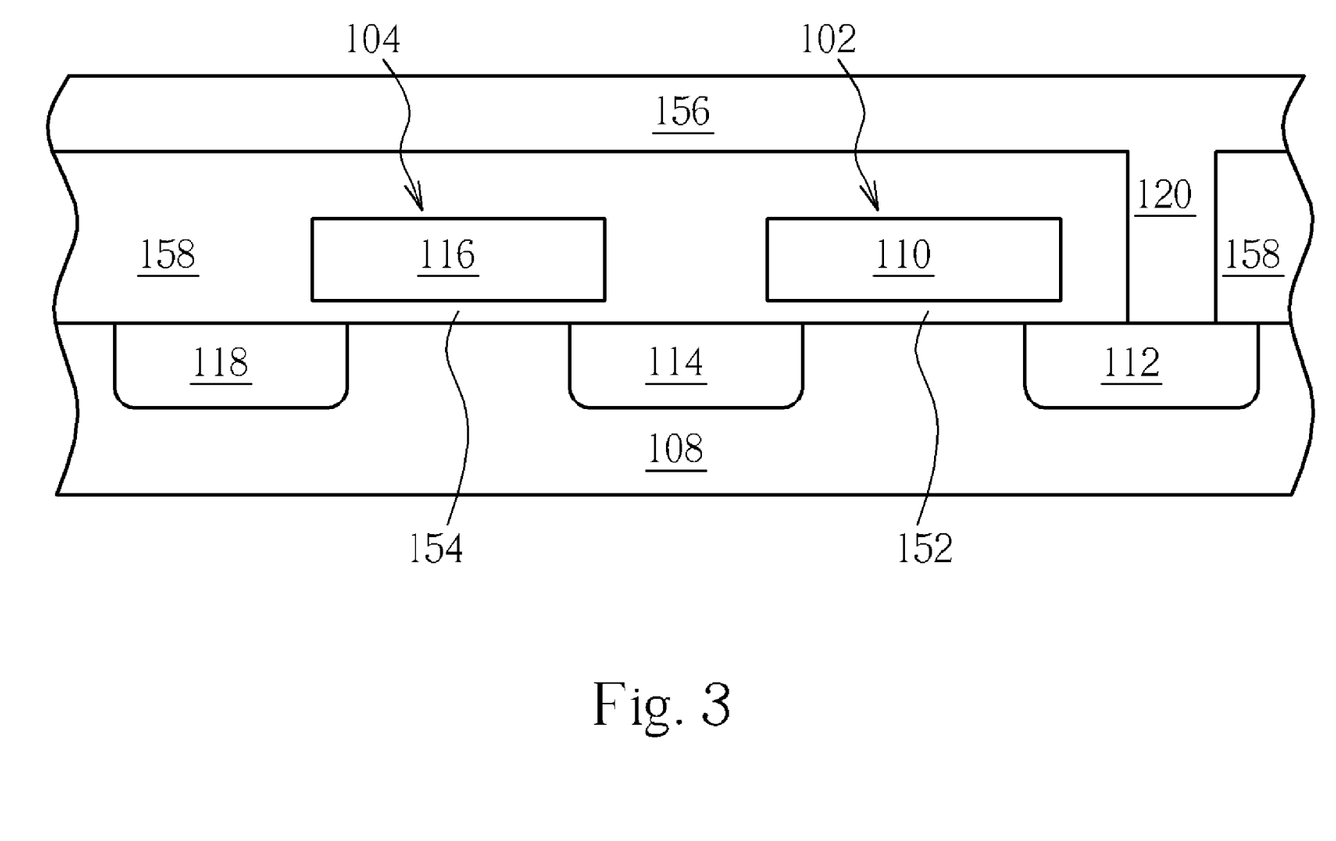
FIG. 3 is a schematic, cross-sectional view of the EEPROM of FIG. 2 along line A–A'.

Please refer to FIG. 3. FIG. 3 is a schematic, cross-sectional view of the EEPROM of FIG. 2 along line A–A'. As shown in FIG. 3, the first PMOS transistor 102 is serially connected to the second PMOS transistor 104. The first PMOS transistor 102 includes the floating gate 110, the first P+ doped drain region 112, the first P+ doped source region 114, and a floating gate oxide layer 152 underneath the floating gate 110. The second PMOS transistor 104 includes the gate 116, a gate oxide layer 154 underneath the gate 116, and the second P+ doped source region 118. As mentioned above, the first P+ doped source region 114 of the first PMOS transistor 102 also functions as a drain of the second PMOS transistor 104, thereby electrically connecting the first PMOS transistor 102 with the second PMOS transistor 104. The first P+ doped drain region 112 is electrically connected with a bit line 156 through the contact plug 120. The contact plug 120 is manufactured in a dielectric layer 158 made of, for example, BPSG, PSG, silicon dioxide or the like. The bit line 156 is defined over the dielectric layer 158. In the preferred embodiment of the present invention, the thickness of the floating gate oxide layer 152, the thickness of the gate oxide layer 154, and the thickness of gate oxide layer fabricated in a logic circuit area are the same. However, extra thermal processes may be carried out to increase the thickness of the floating gate oxide layer 152 or the thickness of the gate oxide layer 154. In either case, the simplified single-poly EEPROM device of the present invention can be combined with standard CMOS semiconductor processes.

Figure 4:
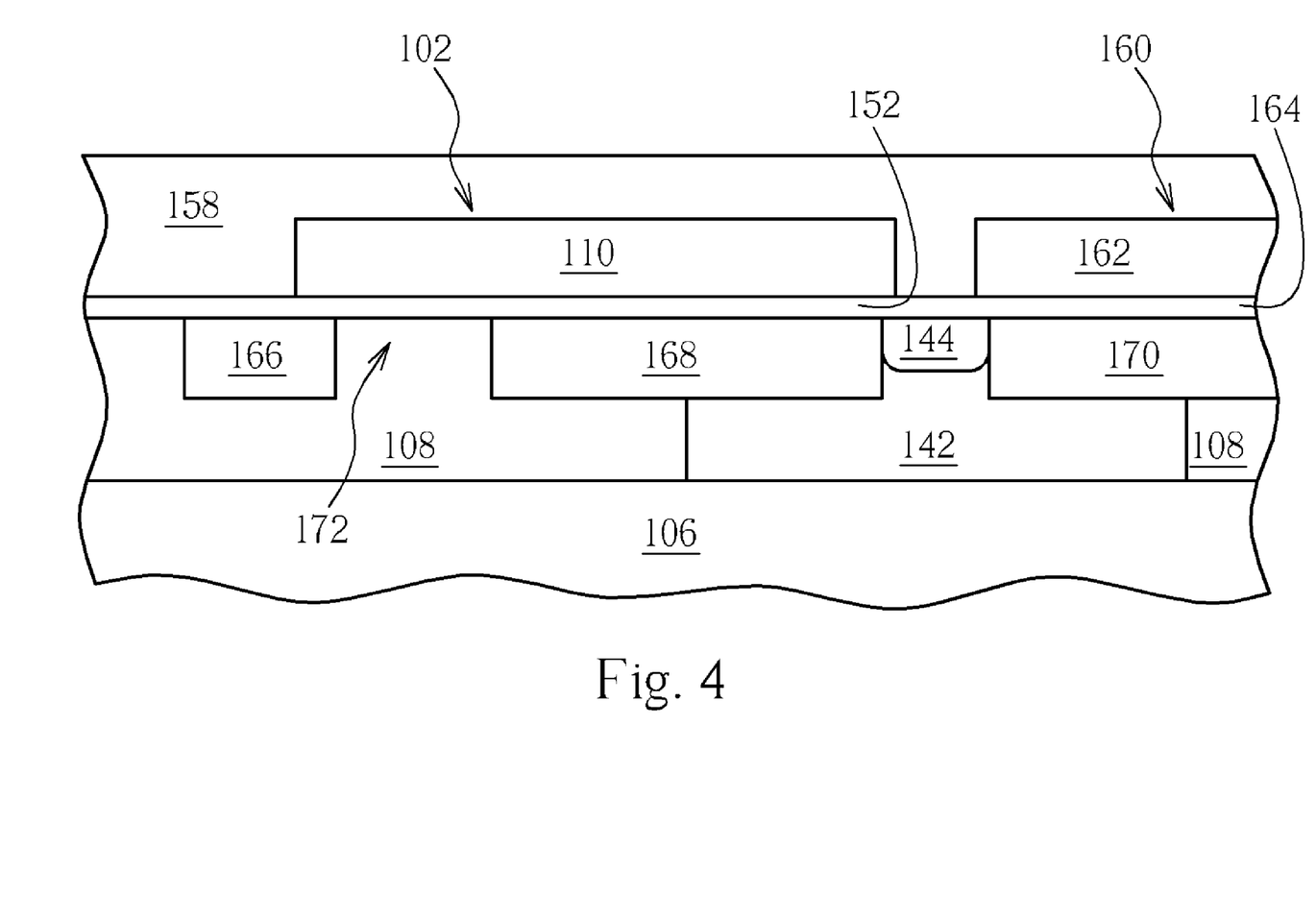
FIG. 4 is a schematic, cross-sectional view of the EEPROM of FIG. 2 along line B–B'.

Please refer to FIG. 4. FIG. 4 is a schematic, cross-sectional view of the EEPROM of FIG. 2 along line B–B'. As shown in FIG. 4, the first PMOS transistor 102 and a third PMOS transistor 160 is disposed in the dielectric layer 158. The third PMOS transistor 160 includes a floating gate 162 and a floating gate oxide layer 164. The floating gate 110 and 162 both cover the N-well 108 and extend to the N+ doped region 144. The N+ doped region 144 is located in the P-well 142. The single-poly EEPROM of the present invention further includes a plurality of shallow trench isolations (STI) 166, 168, and 170 to prevent the P-well 142 and the N+ doped region 144 from overlapping with a P-channel region 172 of the first PMOS transistor 102 and a P-channel region (not shown in FIG. 4) of the third PMOS transistor 160.

Figure 5:
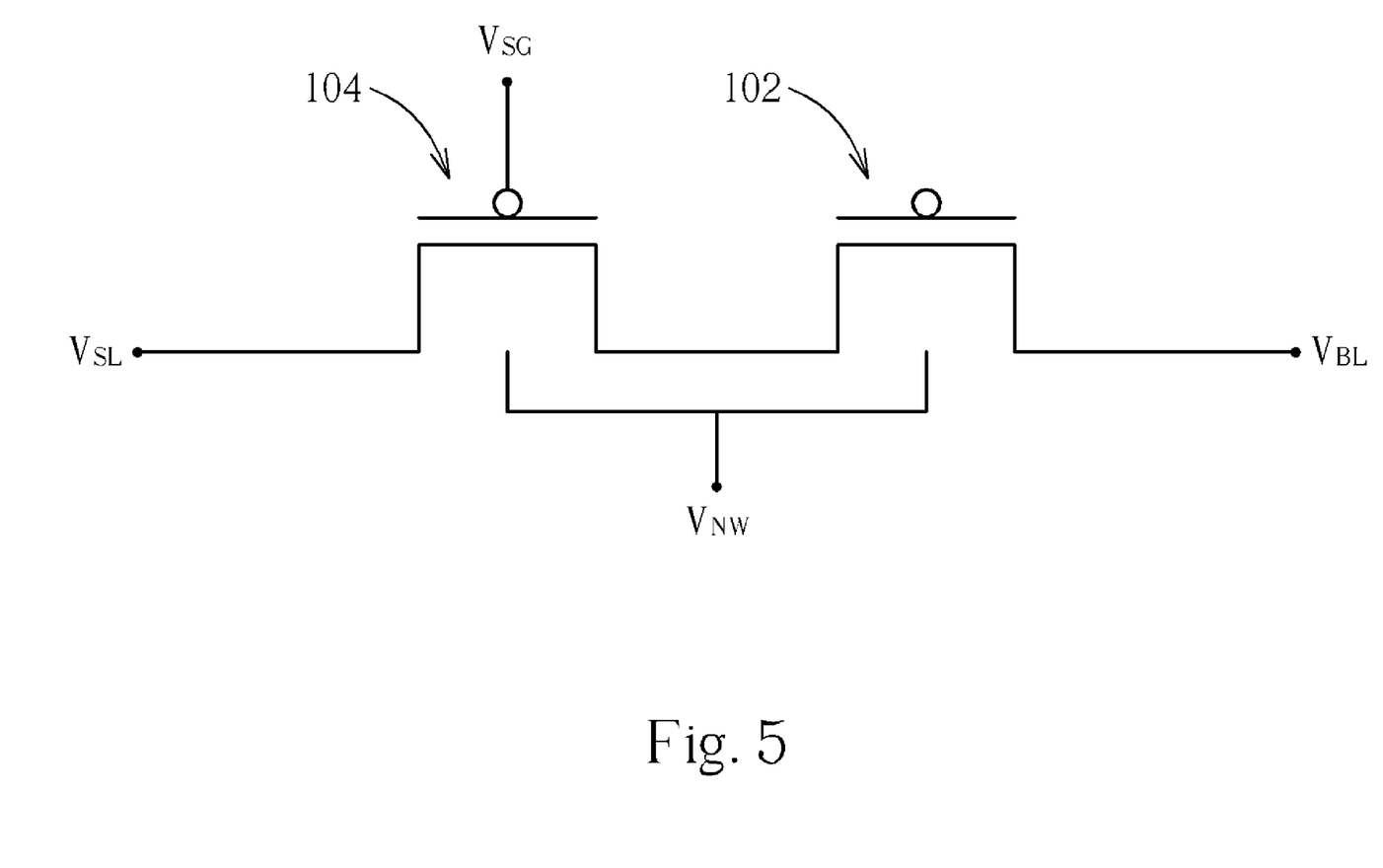
FIG. 5 is an equivalent circuit corresponding to the EEPROM unit depicted in FIG. 3.

Please refer to FIG. 5 and FIG. 3. FIG. 5 is an equivalent circuit corresponding to the EEPROM unit 100 depicted in FIG. 3. As shown in FIG. 5, when operating, a bit line voltage ($V_{BL}$) is applied to the first P+ doped drain region 112 of the first PMOS transistor 102. The floating gate 122 is in a floating state. An N-well voltage ($V_{NW}$) is applied to the N-well 108. The second PMOS transistor 104 acts as a select transistor. A select gate voltage ($V_{SG}$) or word line voltage ($V_{WL}$) is applied to the gate 116, also called a select gate, of the second PMOS transistor 104. A source line voltage ($V_{SL}$) is applied to the second P+ doped source region 118 of the second PMOS transistor 104.

The operation of the EEPROM according to the present invention will now be described in detail with reference to an exemplary operation chart (see Table 1), FIG. 3 and FIG. 5.

line, the N-well 108, and the P-well 142 ($V_N^+$, $V_{SL}$, $V_{NW}$, and $V_{PW}$) are 0V, 5–7V, 5–7V, and 0V, respectively. The unselected word line is applied with a voltage ($V_{WL(unselected)}$) having a same voltage level as $V_{SL}$, for example, 5–7V. The unselected bit line is applied with a voltage ($V_{BL(unselected)}$) having a voltage level also the same as $V_{SL}$, for example, 5–7V. The floating gate 110 is in a floating state. As seen in the second row of table, when writing data "0" into a selected EEPROM unit, a relatively high-level bit line voltage $V_{BL(selected)}$, for example, 5–7V, is applied to the first P+ doped drain region 112 of the first PMOS transistor 102 of the selected EEPROM unit.

Figure 6:
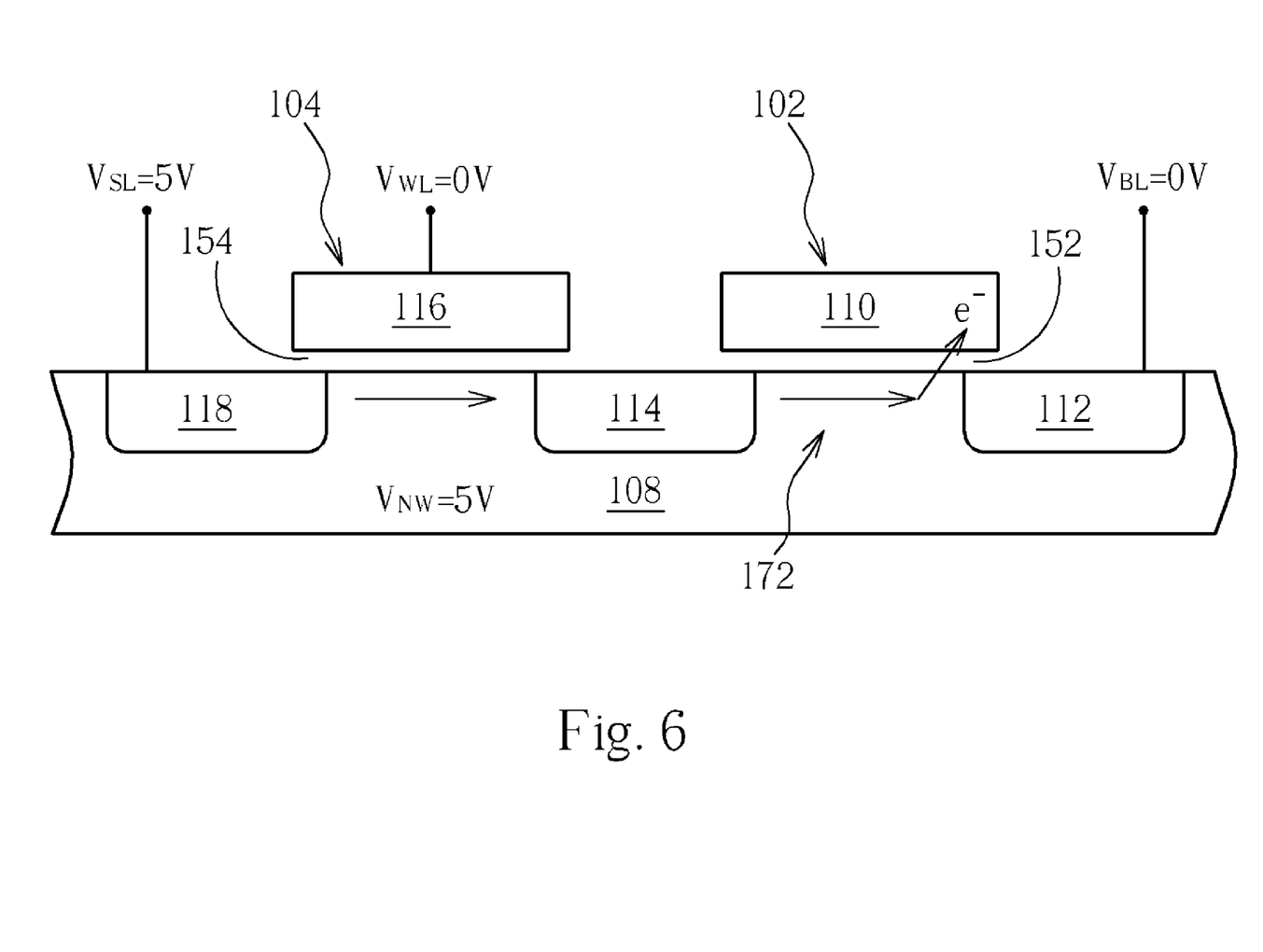
FIG. 6 is a cross-sectional diagram schematically illustrating the writing operation on a selected EERPOM unit associated with a first row of Table 1.

Please refer to FIG. 6 with reference to Table 1. FIG. 6 is a cross-sectional diagram schematically illustrating the writing operation on a selected EERPOM unit associated with the first row of Table 1. As shown in FIG. 6, a selected EERPOM unit is in the following exemplary voltage condition in accordance with the present invention: a word line voltage $V_{WL}$=0V, a bit line voltage $V_{BL}$=0V, the floating gate 110 floating, a source line voltage $V_{SL}$=5V, an N-well voltage $V_{NW}$=5V, an N+ doped region voltage $V_N^+$=0V and a P-well voltage $V_{PW}$=0V. Under the above voltage condition, a first induced voltage, which is about −1–−2V lower than the N-well voltage $V_{NW}$, will be sensed by the floating gate 110 due to capacitive coupling effects, thereby turning on the P-channel region 172 underneath the floating gate 110. Hot carriers such as electrons tunnel through the floating gate oxide layer 152 a by way of the turned on P-channel region 172 and are finally trapped inside the floating gate 110.

TABLE 1

| Operation | | $V_{WL}$ | | $V_{BL}$ | | $V_N^+$ | $V_{SL}$ | $V_{NW}$ | $V_{PW/PG}$ |
|---|---|---|---|---|---|---|---|---|---|
| | | Selected WL | Unselected WL | Selected BL | Unselected BL | | | | |
| Program | 1 | 0 V | 5–7 V | 0 V | 5–7 V | 0 V | 5–7 V | 5–7 V | 0 V |
| | 0 | 0 V | 5–7 V | 5–7 V | 5–7 V | 0 V | 5–7 V | 5–7 V | 0 V |
| Read | | 0 V | 3.3 V | 1.8 V | 3.3 V | 3.3 V | 3.3 V | 3.3 V | 0 V |
| Erase(1) | | 0–2 V | | −4–−7 V | | 4–7 V | Floating | 0 V | −4–−7 V |
| Erase(2) | | −4–−7 V | 0 V–2 V | −4–−7 V | | 4–7 V | −4–−7 V | 0 V | −4–−7 V |

In Table 1, the first (leftmost) column demonstrates different operation statuses including programming, reading, and erasing of the EEPROM according to the present invention. The operation voltage conditions regarding writing data "1" into a selected memory cell are demonstrated in the first row of Table 1. The operation voltage conditions regarding writing data "0" into a selected memory cell are demonstrated in the second row of Table 1. The operation voltage conditions regarding reading data stored in memory cells are demonstrated in the third row of Table 1. The operation voltage conditions regarding a first kind of erasing data stored in memory cells are demonstrated in the fourth row of Table 1. The operation voltage conditions regarding a second kind of erasing data stored in memory cells are demonstrated in the fifth row of Table 1. First, referring to the first row of Table 1, when programming the EEPROM (writing data "1"), a relatively low-level word line voltage $V_{WL}$ (or $V_{SG}$), for example, 0V, is applied to the select gate 116 of a selected EEPROM unit. A same low-level bit line voltage $V_{BL}$ as the low-level word line voltage $V_{WL}$, for example, 0V, is applied to the first P+ doped drain region 112 of the first PMOS transistor 102 of the selected EEPROM unit. Voltages applied to the N+ doped region 144, the source Referring to the third row of Table 1 with reference to FIG. 5, when reading the EEPROM, a relatively low-level word line voltage $V_{WL}$ (or $V_{SG}$), for example, 0V, is applied to the select gate 116 of a selected EEPROM unit. The unselected word line is applied with a relatively high-level voltage of, for example, 3.3V. A selected bit line voltage $V_{BL(selected)}$ of, for example, 1.8V, is applied to the first P+ doped drain region 112 of the first PMOS transistor 102 of the selected EEPROM unit. The unselected bit line is applied with a voltage $V_{BL(unselected)}$=3.3V. Voltages applied to the N+ doped region 144, the source line, the N-well 108, and the P-well 142 ($V_N^+$, $V_{SL}$, $V_{NW}$, and $V_{PW}$) are 3.3V, 3.3V, 3.3V, and 0V, respectively. The floating gate 110 is in a floating state.

Referring to the fourth row of Table 1 with reference to FIG. 5, when erasing the EEPROM according to first kind, a relatively low-level word line voltage $V_{WL}$ (or $V_{SG}$), for example, 0–2V, is applied. A relatively low-level bit line voltage $V_{BL}$, for example, −4–−7V, is applied to the first P+ doped drain region 112 of the first PMOS transistor 102. The source line voltage $V_{SL}$ is in a floating state. Voltages applied to the N-well 108, the N+ doped region 144, and the P-well 142 ($V_{NW}$, $V_N^+$, $V_{PW}$) are 0V, 4–7V, and −4–−7V. Therefore, an avalanche breakdown is induced to generate hot holes and a second induced voltage is obtained by the floating gate due to capacitive coupling effects to attract hot holes of electron/hole pairs and a so-called edge Fowler-Nordheim mechanism occurs between the edge of the floating gate 110 and the subjacent N+ doped region 144, thereby pulling out electrons from the floating gate 110. The P-well voltage $V_{PW}$ could be different from the bit line voltage $V_{BL}$, which is the voltage applied to the first P+ doped drain region 112. Please refer to the fifth row of Table 1. It should be noted that, when erasing the EEPROM, a source line voltage $V_{SL}$ could be applied to the second P+ doped source region 118, for example −4-−7V, and the second PMOS transistor 104 is turned on to make the first P+ doped source region 114 also have the source line voltage $V_{SL}$ to enhance the second induced voltage.

Figure 7:
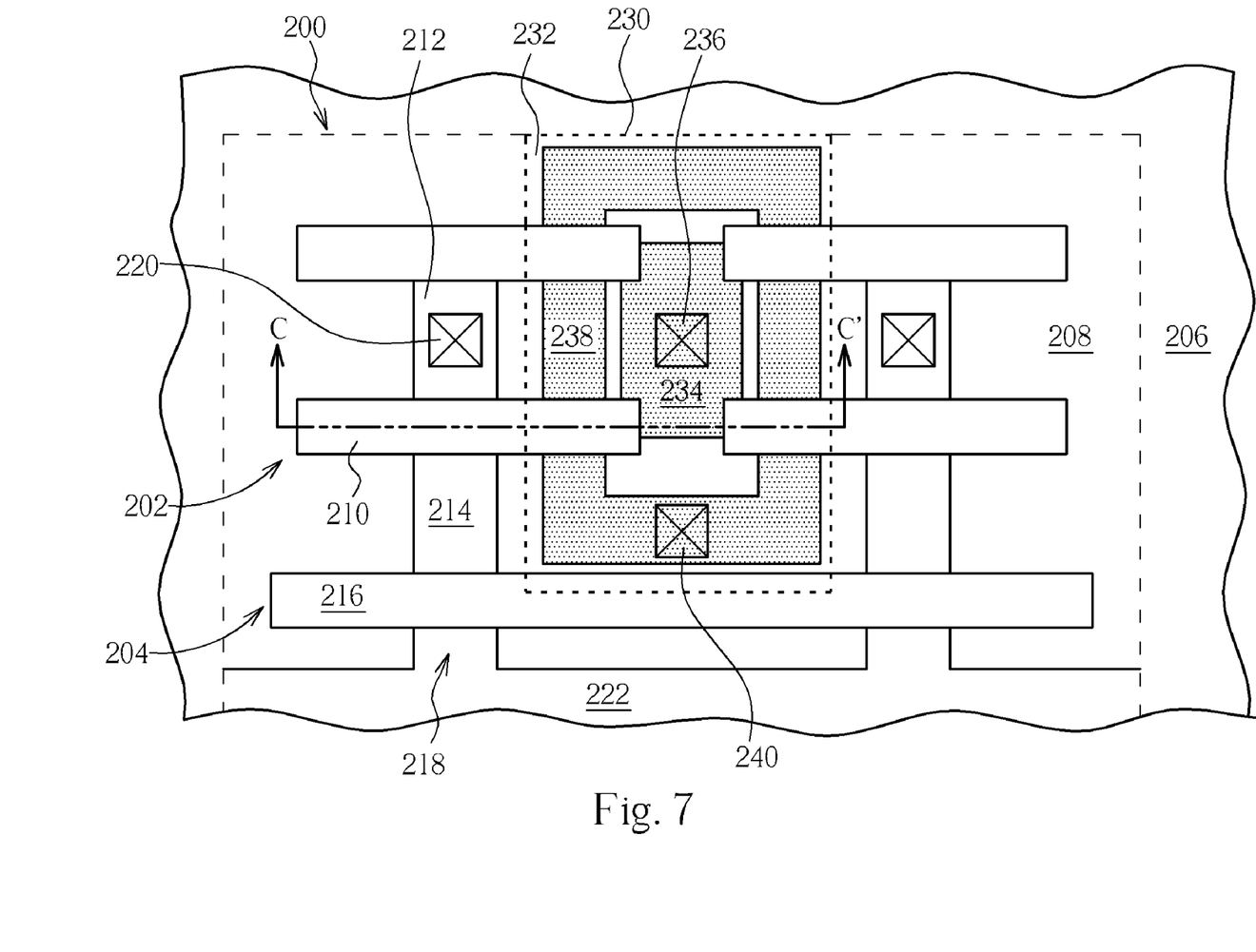
FIG. 7 is a plane view schematically illustrating a partial layout of a single-poly EEPROM according to a second preferred embodiment of the present invention.

Please refer to FIG. 7. FIG. 7 is a plane view schematically illustrating a partial layout of a single-poly EEPROM according to a second preferred embodiment of the present invention. The difference between the first embodiment and the second embodiment of the present invention is that a EEPROM unit 200 in the second embodiment further includes a P+ doped guard ring 238 located in the P-well 232, and the floating gate 210 covers a portion of the P+ doped guard ring 238 to form a P+ junction underneath the floating gate 210. A voltage applied to the P+ doped guard ring 238 is the same as a voltage applied to the P-well 232.

As shown in FIG. 7, a single-poly EEPROM unit 200 includes a first PMOS transistor 202 and a second PMOS transistor 204 serially connected to the first PMOS transistor 202. The first PMOS transistor 202 and the second PMOS transistor 204 are formed on an N-well 208, as indicated by the dashed line in FIG. 7, of a P type substrate 206. The first PMOS transistor 202 includes a floating gate 210, a first P+ doped drain region 212, and a first P+ doped source region 214. The second PMOS transistor 204 includes a gate 216 and a second P+ doped source region 218, and the first P+ doped source region 214 of the first PMOS transistor 202 serves as a drain of the second PMOS transistor 204, thereby electrically connecting the first PMOS transistor 202 with the second PMOS transistor 204. It is understood that the floating gate 210 consists of a single layer polysilicon according to the present invention, that is, there is no word line or control gate stacked thereon. The first P+ doped drain region 212 is electrically connected to a bit line (not explicitly shown in FIG. 7) through a contact plug 220. The second P+ doped source region 218 of the second PMOS transistor 204 is electrically connected with a source line 222. Preferably, the source line 222 is an embedded P+ doped region that is manufactured simultaneously with the second P+ doped source region 218 in an ion implantation process.

The single-poly EEPROM unit 200 further includes a diode 230 located in the P type substrate 206 and in a vicinity of the floating gate 230. The diode 230 includes a P-well 232 and an N+ doped region 234 disposed in the P-well 232. The N+ doped region 234 is electrically connected with an N+ doped source region voltage ($V_N^+$) through a contact plug 236. The P-well 232 further includes a P+ doped guard ring 238 connected with a P+ doped guard ring voltage ($V_{PG}$) through a contact plug 240, and the P+ doped guard ring voltage ($V_{PG}$) voltage is the same as the voltage of the P-well 232 called a P-well voltage ($V_{PW}$).

Figure 8:
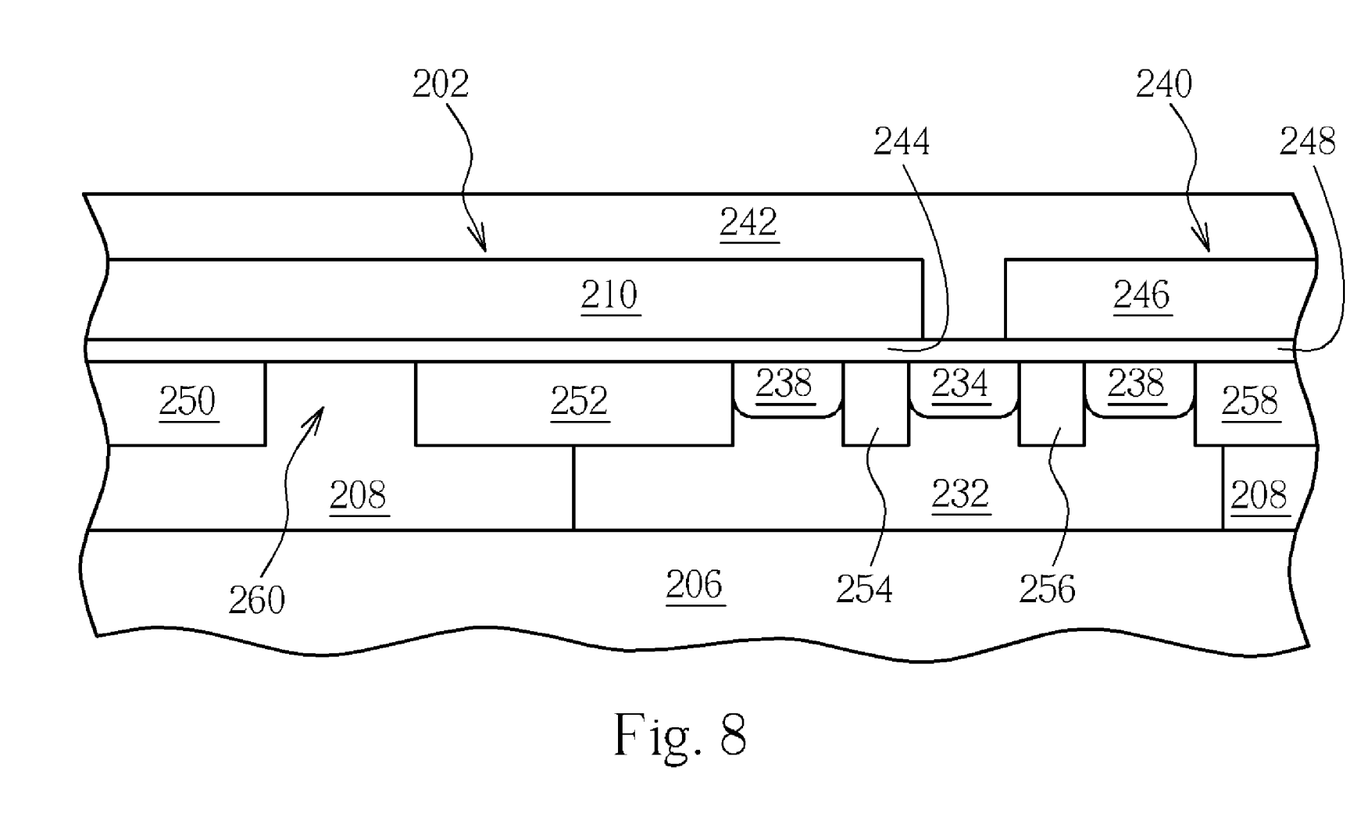
FIG. 8 is a schematic, cross-sectional view of the EEPROM of FIG. 7 along line C–C'.

Please refer to FIG. 8. FIG. 8 is a schematic, cross-sectional view of the EEPROM of FIG. 7 along line C–C'. As shown in FIG. 8, the first PMOS transistor 202 and a third PMOS transistor 240 are disposed in the dielectric layer 242.

The first PMOS transistor 202 includes a floating gate 210 and a floating gate oxide layer 244. The third PMOS transistor 240 includes a floating gate 246 and a floating gate oxide layer 248. The floating gate 210 and 246 both cover the N-well 208 and extend to the N+ doped region 234 and the P+ doped guard ring 238. A junction region of the P-well 232 and the N+ doped region 234 overlapped beneath the floating gate 210 and 246 serves as an avalanche injection point in a vicinity of the first PMOS transistor 202. The N+ doped region 234 and the P+ doped guard ring 238 are located in the P-well 232. The single-poly EEPROM of the present invention further includes a plurality of shallow trench isolation (STI) 250, 252, 254, 256, and 258 to prevent the P+ doped guard ring 238, the P-well 232 and the N+ doped region 234 from overlapping with a P-channel region 260 of the first PMOS transistor 202 and a P-channel region (not shown in FIG. 8) of the third PMOS transistor 240.

Operating the single-poly EEPROM unit 200 of the second embodiment is the same as operating the single-poly EEPROM unit 100 of the first embodiment, so unnecessary details are not to be given here. It should be noted that applying a positive voltage to the N+ doped region 234 while applying a negative voltage to the P+ doped guard ring 238 and the P-well 232 underneath the floating gate 210 induces an avalanche breakdown, and applying a negative voltage the first P+ doped drain region 212 makes the floating gate 210 obtain an enhanced induced negative voltage due to capacitive coupling effects to enhance an avalanche hot hole injection and attract hot holes from electron/hole pairs so that electrons are released from the floating gate 210 by way of tunneling, thereby increasing the erasure efficiency and the voltage difference between the floating 210 an the P+ doped guard ring 238 to give a wide process window. The negative voltage applied to the P+ doped guard ring 238 could be different from the negative voltage applied to the first P+ doped drain region 212.

Compared to the prior art, the present invention utilizes the avalanche breakdown generated in a junction region of the P-well and the N+ doped region underneath the floating gate. Thereby, hot holes inject into a floating gate to neutralize the trapped electrons and Fowler-Nordheim tunneling is utilized to pull out electrons from the floating gate for executing erasure. Therefore, a single-poly EPPROM of the present invention has the following advantages:

1. The present invention utilizes a low voltage to execute an erasure operation so that the single-poly EPPROM can be fabricated with conventional CMOS process sequences without any extra process step for saving production costs.

2. The present invention utilizes the avalanche hot hole injection mechanism, whose operation speed is faster than Fowler-Nordheim tunneling, and the program/erasure cycle and the testing costs are reduced.

3. The present invention further includes a P-well underneath the floating gate. When an electrically erasure is performed, a negative voltage could be applied to the P-well to increase the voltage difference and enhance the avalanche hot hole injection mechanism and Fowler-Nordheim tunneling.

4. The present invention further includes a P+ doped guard ring underneath the floating gate in the P-well for increasing the erasure efficiency and increasing the voltage difference between the floating gate and the P+ doped guard ring to give a wide process window.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A single-poly EEPROM, comprising:
   a first PMOS transistor serially connected to, a second PMOS transistor, wherein the first and second PMOS transistors are both formed on an N-well of a P type substrate, and wherein the first PMOS transistor includes a floating gate, a first P+ doped drain region, and a first P+ doped source region, the second PMOS transistor includes a gate and a second P+ doped source region, and the first P+ doped source region of the first PMOS transistor serves as a drain of the second PMOS transistor; and
   a diode located in the P type substrate, wherein the diode includes a P-well and an N+ doped region disposed in the P-well, and wherein the floating gate of the first PMOS transistor overlaps with the N-well and the P type substrate and extends to the P-well and N+ doped region, and a junction region of the P-well and the N+ doped region overlapped beneath the floating gate serves as an avalanche injection point in a vicinity of the first PMOS transistor.

2. The single-poly EEPROM of claim 1, wherein the first PMOS transistor is a floating single-gate transistor without any control gate formed above the floating gate of the first PMOS transistor.

3. The single-poly EEPROM of claim 1, wherein the P-well and N+ doped region substantially does not overlap with a P-channel region of the first PMOS transistor.

4. The single-poly EEPROM of claim 3, wherein when operating the single-poly EEPROM, a drain voltage is applied to the first P+ doped drain region while the second PMOS transistor is turned on, so that the first P+ doped source region obtains a source line voltage, and the floating gate of the first PMOS transistor obtains a first induced voltage due to capacitive coupling effects so that the P-channel of the first PMOS transistor is turned on and electrons are injected through a gate oxide and stored in the floating gate through a channel hot electron injection mechanism.

5. The single-poly EEPROM of claim 1, wherein when operating the single-poly EEPROM, a first positive voltage is applied to the N+ doped region while a first negative voltage is applied to the P-well to induce an avalanche breakdown, and a second negative voltage is applied to the first P+ doped drain region to make the floating gate obtain a second induced voltage due to capacitive coupling effects to attract hot holes from electron/hole pairs so that electrons are released from the floating gate by way of tunneling.

6. The single-poly EEPROM of claim 5, wherein when operating the single-poly EEPROM, the second induced voltage is a negative voltage.

7. The single-poly EEPROM of claim 5, wherein when operating the single-poly EEPROM, the first negative voltage applied to the P-well is different from the second negative voltage applied to the first P+ doped drain region.

8. The single-poly EEPROM of claim 5, wherein when operating the single-poly EEPROM, a third negative voltage is further applied to the second P+ doped source region while the second PMOS transistor is turned on, and thereby the first P+ doped source region also obtains the third negative voltage to enhance the second induced voltage of the floating gate.

9. A single-poly EEPROM, comprising:
   a first PMOS transistor serially connected to a second PMOS transistor, wherein the first and second PMOS transistors are both formed on an N-well of a P type substrate, and wherein the first AMOS transistor includes a floating gate, a first P+ doped drain region, and a first P+ doped source region, the second PMOS transistor includes a gate and a second P+ doped source region, and the first P+ doped source region of the first PMOS transistor serves as a drain of the second PMOS transistor;
   a diode located in the P type substrate, wherein the diode includes a P-well and an N+ doped region disposed in the P-well, and wherein the floating gate of the first PMOS transistor overlaps with the N-well and the P type substrate and extends to the P-well and N+ doped region, and a junction region of the P-well mid the N+ doped region overlapped beneath the floating gate serves as an avalanche injection point in a vicinity of the first PMOS transistor; and
   a P+ doped guard ring located in the P-well, wherein the floating gate of the first PMOS transistor overlaps with a portion of the P+ doped guard ring to form a P+ junction beneath the floating gate, and wherein a voltage applied to the P+ doped guard ring is the same as a voltage applied to the P-well.

10. The single-poly EEPROM of claim 9, wherein the first PMOS transistor is a floating single-gate transistor without any control gate formed above the floating gate of the first PMOS transistor.

11. The single-poly EEPROM of claim 9, wherein the P-well and N+ doped region substantially does not overlap with a P-channel region of the first PMOS transistor.

12. The single-poly EEPROM of claim 11, wherein when operating the single-poly EEPROM, a drain voltage is applied to the first P+ doped drain region while the second PMOS transistor is turned on, so that the first P+ doped source region obtains a source line voltage, and the floating gate of the first PMOS transistor obtains a first induced voltage due to capacitive coupling effects so that the P-channel of the first PMOS transistor is turned on and electrons are injected through a gate oxide and stored in the floating gate through a channel hot electron injection mechanism.

13. The single-poly EEPROM of claim 9, wherein when operating the single-poly EEPROM, a first positive voltage is applied to the N+ doped region while a first negative voltage is applied to the P+ doped guard ring and the P-well to induce an avalanche breakdown, and a second negative voltage is applied to the first P+ doped drain region to make the floating gate obtain a second induced voltage due to capacitive coupling effects to enhance an avalanche hot hole injection and attract hot holes from electron/hole pairs so that electrons are released from the floating gate by way of tunneling.

14. The single-poly EEPROM of claim 13, wherein when operating the single-poly EEPROM, the second induced voltage is a negative voltage.

15. The single-poly EEPROM of claim 13, wherein when operating the single-poly EEPROM, the First negative voltage applied to the P+ doped guard ring is different from the second negative voltage applied to the first P+ doped drain region.

16. The single-poly EEPROM of claim 13, wherein when operating the single-poly EEPROM, a third negative voltage is further applied to the second P+ doped source region while the second PMOS transistor is turned on, and thereby the first P+ doped source region also obtains the third negative voltage to enhance the second induced voltage of the floating gate.

* * * * *